United States Patent [19]

Nagasaka et al.

[11] Patent Number: 4,966,830
[45] Date of Patent: Oct. 30, 1990

[54] PHOTOPOLYMERIZABLE COMPOSITION

[75] Inventors: Hideki Nagasaka, Yamato; Katsuko Ohta, Yokohama, both of Japan

[73] Assignee: Mitsubishi Kasei Corporation, Tokyo, Japan

[21] Appl. No.: 217,981

[22] Filed: Jul. 12, 1988

[30] Foreign Application Priority Data

Jul. 21, 1987 [JP] Japan .................. 62-181317
Mar. 2, 1988 [JP] Japan .................. 63-049017

[51] Int. Cl.$^5$ .................. G03C 1/72; G03C 1/68
[52] U.S. Cl. .................. 430/281; 430/277; 430/916; 430/288
[58] Field of Search ............ 430/920, 281, 916, 288, 430/277

[56] References Cited

U.S. PATENT DOCUMENTS

| | | | |
|---|---|---|---|
| 4,147,552 | 4/1979 | Specht et al. | 430/281 |
| 4,162,162 | 7/1979 | Dueter | 430/281 |
| 4,454,218 | 6/1984 | Dueter et al. | 430/281 |
| 4,537,855 | 8/1985 | Ide | 430/288 |
| 4,594,310 | 6/1986 | Nagasaka | 430/281 |

*Primary Examiner*—Paul R. Michl
*Assistant Examiner*—Carmeele B. Veasley

[57] ABSTRACT

A photopolymerizable composition comprising an addition polymerizable compound having at least one ethylenically unsaturated double bond and a photopolymerization initiator system, wherein the photopolymerization initiator system comprises:

(a) at least one sensitizer selected from the group consisting of a compound of the formula:

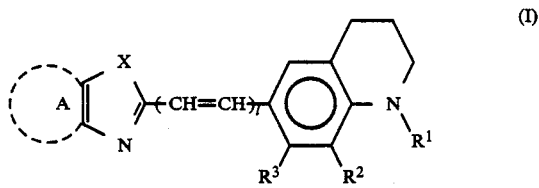

(I)

wherein ring A is a substituted or unsubstituted benzene or naphthalene ring, X is a bivalent atom or bivalent group, $R^1$ is an alkyl group, each of $R^2$ and $R^3$ is hydrogen, an alkyl group, an alkoxy group or an alkylthio group, or $R^1$ and $R^2$ bond to each other, and l is 0, 1 or 2, a compound of the formula:

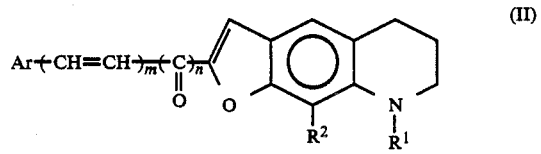

(II)

wherein $R^1$ and $R^2$ are as defined above, Ar is an aromatic group, and each of n and m is 0 or 1, a compound of the formula:

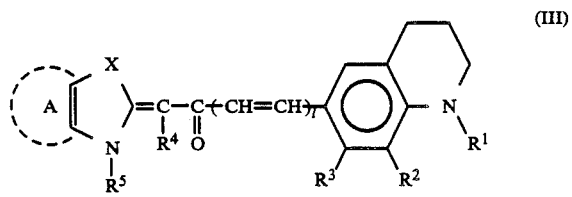

(III)

wherein $R^1$, $R^2$, $R^3$, ring A, X and l are as defined above, $R^4$ is hydrogen, an acetyl group or

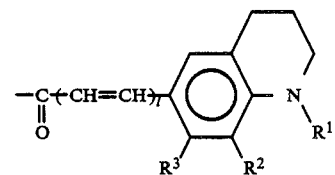

wherein $R^1$, $R^2$, $R^3$ and l are as defined above, and $R^5$ is an alkyl group, and a compound of the formula:

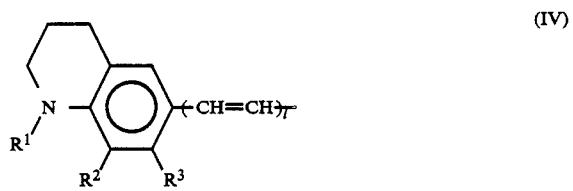

(IV)

wherein $R^1$, $R^2$, $R^3$, X and l are as defined above, and (b) at least one activator capable of generating active radicals when irradiated in the presence of said sensitizer.

10 Claims, No Drawings

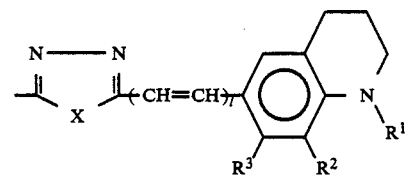

PHOTOPOLYMERIZABLE COMPOSITION

The present invention relates to a photopolymerizable composition. Particularly, it relates to a photopolymerizable composition showing a very high sensitivity to light rays in the visible light range. Heretofore, a number of image forming methods have been known in which a photopolymerizing system is utilized. For example, there are a method wherein a photopolymerizable composition comprising an addition polymerizable compound containing an ethylenic double bond and a photopolymerization initiator, and optionally as an additional component an organic polymer binder, is prepared, this photopolymerizable composition is coated on a substrate to obtain a photosensitive material provided with a layer of the photopolymerizable composition, exposure of a desired image is conducted so that the exposed portion is polymerized and cured, and the unexposed portion is then dissolved and removed to form a cured relief image; a method wherein the above-mentioned photosensitive material comprises a layer of the photopolymerizable composition sandwiched between a pair of substrates, at least one of which is transparent, exposure of an image is conducted from the transparent substrate side to induce a change in the bonding strength due to the radiation, and then the substrate is peeled off to form the image; and a method wherein an image is formed by utilizing a change in the adhesion of a toner caused by radiation to a layer of a photopolymerizable composition. As the photopolymerization initiator of the photopolymerizable composition used in these methods, benzoin, benzoin alkyl ether, benzil ketal, benzophenone, anthraquinone, benzil or Michler's ketone has been employed. However, these photopolymerization initiators are inferior in their ability to initiate photopolymerization with light rays in the visible light range of at least 400 nm as compared with their ability to initiate photopolymerization with light rays in the ultraviolet light range of at most 400 nm. Thus, they have restricted the range of application of the photopolymerizable compositions containing them. In recent years, with the progress of image-forming techniques, there has been a strong demand for photopolymers highly sensitive to light rays in the visible light range. For example, they are photosensitive materials suitable for non-contact type projection exposure plate making or laser plate making by a visible light laser. Among these techniques, a plate making system employing an oscillation beam of 488 nm of an argon ion laser is considered to be one of the most prospective techniques.

Heretofore, there have been some proposals with respect to photosensitive materials for photopolymerization containing a photopolymerization initiator system sensitive to light rays in the visible light range. For example, a system comprising a hexaarylbiimidazole, a radical generating agent and a dye (Japanese Examined Patent Publication No. 37377/1970), a system comprising a hexaarylbiimidazole and a (p-dialkyl aminobenzylidene)ketone (Japanese Unexamined Patent Publication Nos. 2528/1972 and 155292/1979), a system comprising a cyclic cis-α-dicarbonyl compound and a dye (Japanese Unexamined Patent Publication No. 84183/1973), a system comprising a substituted triazine and merocyanine dye (Japanese Unexamined Patent Publication No. 151024/1979), a system comprising ketocoumarin and an activator (Japanese Unexamined Patent Publication Nos. 112681/1977, 15503/1983 and 88005/1985), a system comprising a substituted triazine and a sensitizer (Japanese Unexamined Patent Publication Nos. 29803/1983 and 40302/1983), a system comprising a biimidazole, a styrene derivative and thiol (Japanese Unexamined Patent Publication No. 56403/1984) and a system comprising an organic peroxide and a dye (Japanese Unexamined Patent Publication Nos. 140203/1984 and 189340/1984) may be mentioned.

These conventional techniques are certainly effective to the visual light rays. However, from the practical viewpoint, they are still not adequate. A system having a higher sensitivity has been desired, because, for example, in the case of laser plate making by means of an argon ion laser, if it is possible to conduct the plate making at a high speed by using a lower output laser such as an air cooled argon laser, substantial merits can be brought about from the viewpoint of costs and required time. The present inventors have conducted a study from such a viewpoint and, as a result, have arrived at the present invention.

Accordingly, it is an object of the present invention to provide a photopolymerization initiating system having a higher sensitivity to the visible light rays, particularly to light rays of a long wavelength at a level of 488 nm.

The present invention provides a photopolymerizable composition comprising an addition polymerizable compound having at least one ethylenically unsaturated double bond and a photopolymerization initiator system, wherein the photopolymerization initiator system comprises:

(a) at least one sensitizer selected from the group consisting of a compound of the formula:

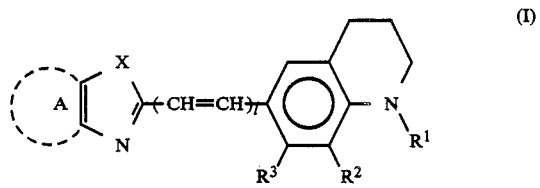

(I)

wherein ring A is a substituted or unsubstituted benzene or naphthalene ring, X is a bivalent atom or a bivalent group, $R^1$ is an alkyl group, each of $R^2$ and $R^3$ is hydrogen, an alkyl group, an alkoxy group or an alkylthio group, or $R^1$ and $R^2$ bond to each other, and l is 0, 1 or 2, a compound of the formula:

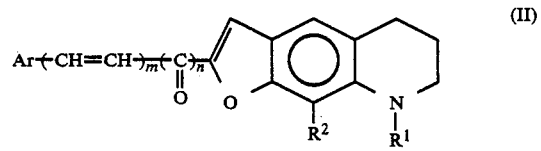

(II)

wherein $R^1$ and $R^2$ are as defined above, Ar is an aromatic group, and each of n and m is 0 or 1, a compound of the formula:

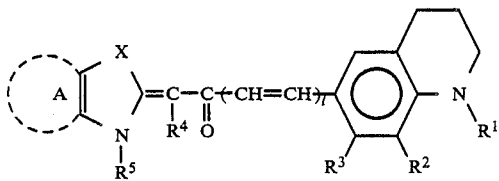
(III)

wherein $R^1$, $R^2$, $R^3$, ring A, X and l are as defined above, $R^4$ is hydrogen, an acetyl group or

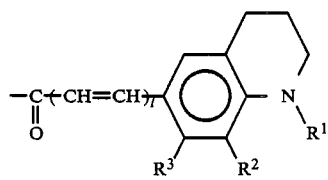

wherein $R^1$, $R^2$, $R^3$ and l are as defined above, and $R^5$ is an alkyl group, and a compound of the formula:

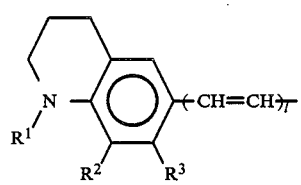
(IV)

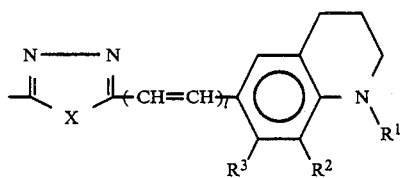

wherein $R^1$, $R^2$, $R^3$, X and l are as defined above, and (b) at least one activator capable of generating active radicals when irradiated in the presence of said sensitizer.

Now, the present invention will be described in detail with reference to the preferred embodiments.

The addition polymerizable compound having at least one ethylenically unsaturated double bond (hereinafter referred to simply as "ethylenic compound") contained as a first essential component in the photopolymerizable composition of the present invention is a compound having an ethylenically unsaturated double bond, which is capable of undergoing addition polymerization and being cured by the action of the photopolymerization initiator system as a second essential component, when the photopolymerizable composition is irradiated with active light rays. For example, it may be a monomer having such a double bond or a polymer having an ethylenically unsaturated double bond in its side chain or main chain. In the present invention, the monomer is meant for a substance as opposed to a so-called polymer substance and includes dimers, trimers and oligomers in addition to monomers in a narrow sense.

The monomer having an ethylenically unsaturated double bond includes, for example, an unsaturated carboxylic acid, an ester of an unsaturated carboxylic acid with an aliphatic polyhydroxy compound, an ester of an unsaturated carboxylic acid with an aromatic polyhydroxy compound and an ester obtained by the esterification reaction of an unsaturated carboxylic acid and a polybasic carboxylic acid with a polyhydroxy compound such as the above-mentioned aliphatic polyhydroxy compound or aromatic polyhydroxy compound.

The above-mentioned ester of an unsaturated carboxylic acid with an aliphatic polyhydroxy compound is not particularly limited and includes, as specific examples, acrylic acid esters such as ethylene glycol diacrylate, triethylene glycol diacrylate, trimethylolpropane triacrylate, trimethylolethane triacrylate, pentaerythritol diacrylate, pentaerythritol triacrylate, pentaerythritol tetracrylate, dipentaerythritol tetracrylate, dipentaerythritol pentacrylate, dipentaerythritol hexacrylate and glycerol acrylate; methacrylic acid esters corresponding to the above examples wherein "acrylate" is changed to "methacrylate"; itaconic acid esters corresponding to the above examples wherein "acrylate" is likewise changed to "itaconate"; crotonic acid esters corresponding to the above examples wherein "acrylate" is likewise changed to "crotonate"; and maleic acid esters corresponding to the above examples wherein "acrylate" is likewise changed to "maleate".

The ester of an unsaturated carboxylic acid with an aromatic polyhydroxy compound includes, for example, hydroquinone diacrylate, hydroquinone dimethacrylate, resorcinol diacrylate, resorcinol dimethacrylate and pyrogallol triacrylate.

The ester obtained by the esterification reaction of an unsaturated carboxylic acid and a polybasic carboxylic acid with a polyhydroxy compound may not necessarily be a single compound. Typical specific examples include a condensation product of acrylic acid, phthalic acid and ethylene glycol, a condensation product of acrylic acid, maleic acid and diethylene glycol, a condensation product of methacrylic acid, terephthalic acid and pentaerythritol and a condensation product of acrylic acid, adipic acid, butane diol and glycerol.

Other ethylenic compounds which may be used in the present invention include, for example, acryl amides such as ethylene bisacrylamide; allyl esters such as diallyl phthalate; and vinyl group-containing compounds such as divinyl phthalate.

The polymer having an ethylenically unsaturated double bond on the main chain includes, for example, a polyester obtained by the polycondensation reaction of an unsaturated dibasic carboxylic acid with a dihydroxy compound, and a polyamide obtained by the polycondensation reaction of an unsaturated dibasic carboxylic acid with a diamine. The polymer having an ethylenically unsaturated double bond at the side chain may be a condensation polymer of a dibasic carboxylic acid having an unsaturated bond at the side chain such as itaconic acid, propylidenesuccinic acid or ethylidenemalonic acid with a dihydroxy or diamine compound. Further, a polymer having a functional group having a reactivity such as a hydroxyl group or a halogenated methyl group in the side chain, such as a polymer obtained by a polymer reaction of e.g. polyvinyl alcohol, poly(2-hydroxyethyl methacrylate) or polyepichlorohydorin with an unsaturated carboxylic acid such as acrylic acid, methacrylic acid or crotonic acid, may also be suitable for use.

Among the above-mentioned ethylenic compounds, monomers of acrylic acid esters or methacrylic acid esters are particularly suitable for use.

Now, the photopolymerization initiator system as a second essential component of the photopolymerizable composition of the present invention will be described.

The photopolymerization initiator system of the present invention is a combination of two components. The first component (a) is a new sensitizer represented by the formula I, II, III or IV.

Specifically, in these formulas, ring A is a substituted or unsubstituted benzene or naphthalene ring, X is a bivalent atom or a bivalent group such as —S—, —O—,

wherein R is a hydrogen atom, an alkyl group, an aryl group or an acyl group, —CH=CH—, —N=CH— or

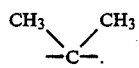

$R^1$ is an alkyl group such as methyl, ethyl, n-propyl, iso-propyl, n-butyl or n-octyl, and each of $R^2$ and $R^3$ is hydrogen; an alkyl group such as methyl, ethyl, propyl or butyl; an alkoxy group such as methoxy, ethoxy or propoxy; propoxy; or an alkylthio group such as methylthio, ethylthio or propylthio, or $R^1$ and $R^2$ may bond to each other to form a bivalent group, for example, an alkylene group such as ethylene, 1,3-propylene or 1,4-butylene; an alkyleneoxy group such as trimethylene monoxy; or an alkylenethio group such as trimethylene monothio. Ar is an aromatic group which includes a substituted or unsubstituted phenyl or naphthyl group such as 4-dimethylaminophenyl, 4-diethylaminophenyl, 9-julolidyl, 4-dimethylamino-1-naphthyl or 2-naphthyl; and a condensed or non-condensed nitrogen-containing hetero aromatic group such as 2-thiazolyl, 2-benzothiazolyl, 2-naphtho(1,2-d)thiazolyl, 8-bromo-2-naphtho(1,2-d)thiazolyl, 2-oxazolyl, 2-benzoxazolyl, 2-naphtho(2,1-d)oxazolyl or 2-benzimidazolyl. $R^4$ is hydrogen, an acetyl group or

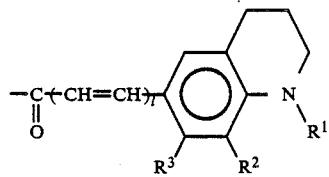

wherein $R^1$, $R^2$, $R^3$ and l are as defined above, and $R^5$ is an alkyl group such as methyl, ethyl, propyl, hexyl or octyl.

These sensitizers have a tetrahydroquinoline structure in their molecules, and it has been found that the sensitivity to the visual light rays is thereby remarkably increased. This effect is remarkable particularly with the compounds represented by the above four types of formulas. By changing an N,N-dialkylbenzene structure in a molecule to a derivative of a tetrahydroquinoline structure, an increase of the sensitivity to a maximum of 6 times to light rays of 488 nm is observed. The usefulness of this effect indicates, as shown in Example 61, the applicability to a low output air cooled argon laser for an image-forming technique by argon ion laser scanning.

Now, such a series of sensitizers of the present invention will be specifically exemplified:

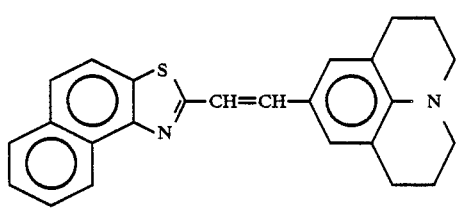

I-1

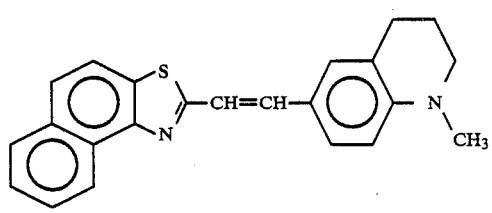

I-2

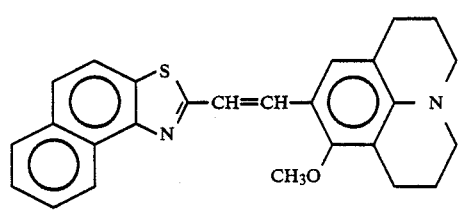

I-3

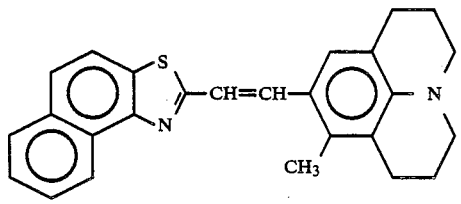  I-4
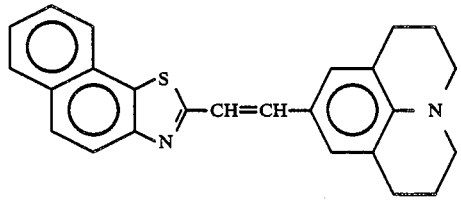  I-5
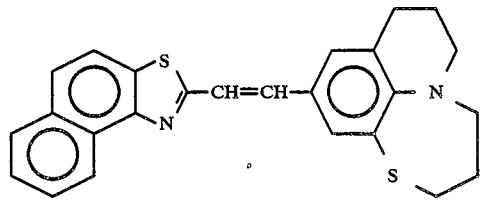  I-6
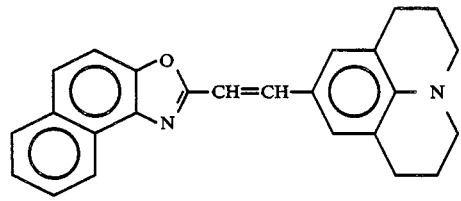  I-7
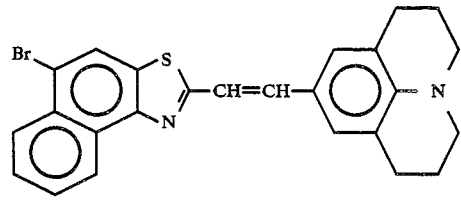  I-8
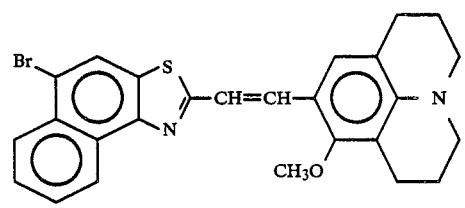  I-9
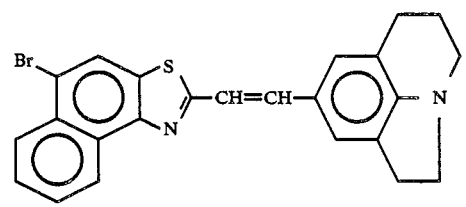  I-10

-continued
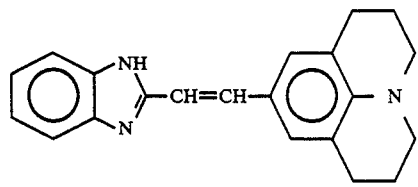 I-11
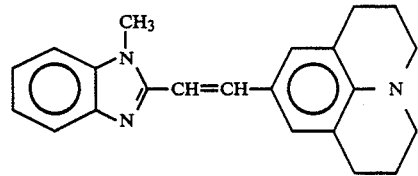 I-12
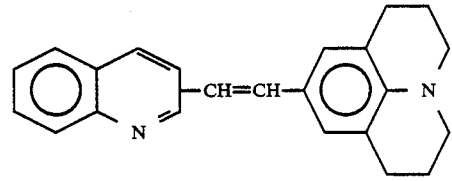 I-13
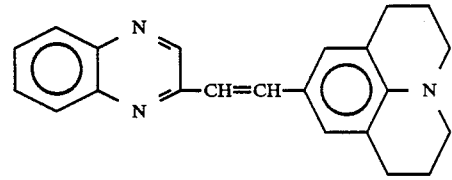 I-14
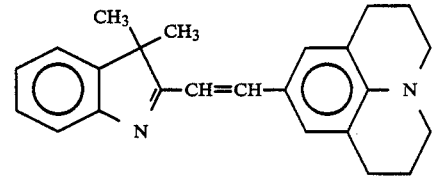 I-15
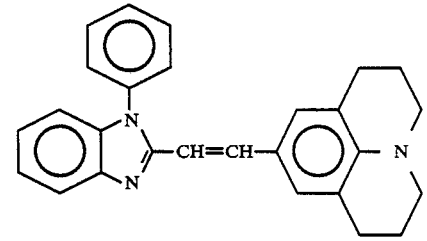 I-16
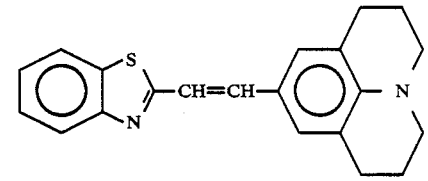 I-17
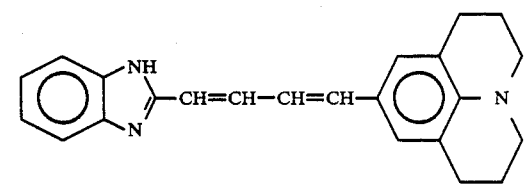 I-18

-continued
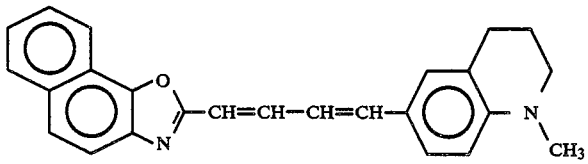
I-19
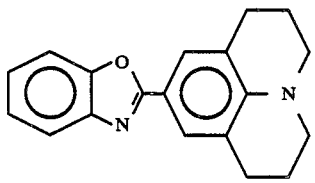
I-20
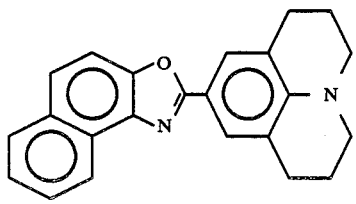
I-21
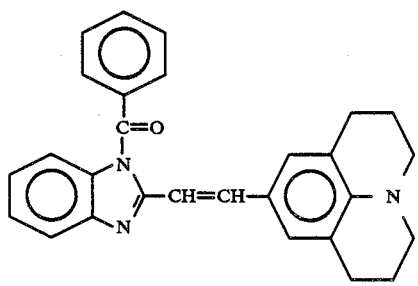
I-22
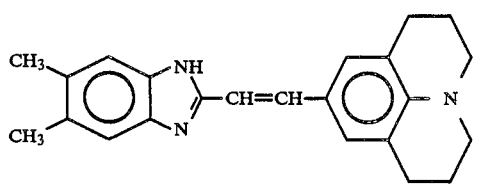
I-23
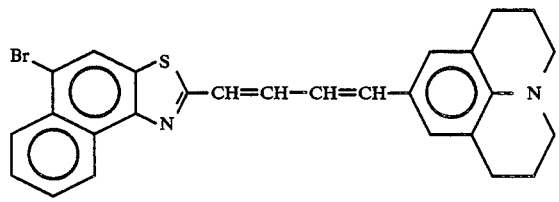
I-24
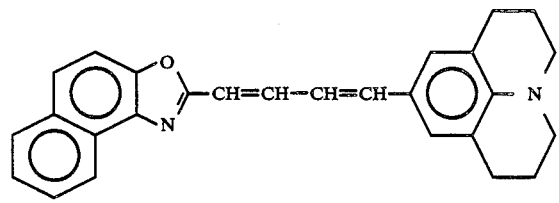
I-25

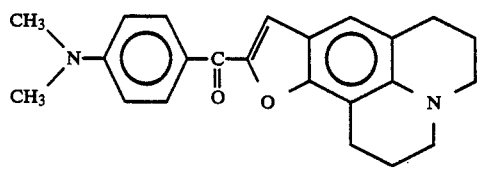
II-1
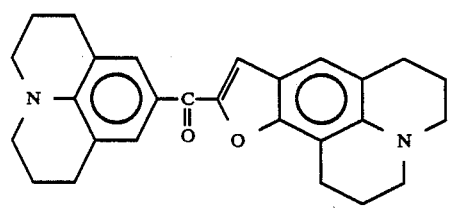
II-2
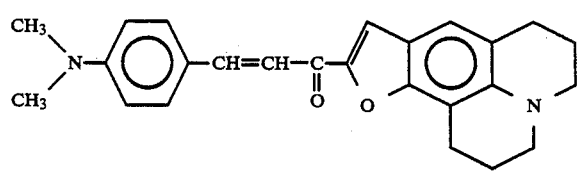
II-3
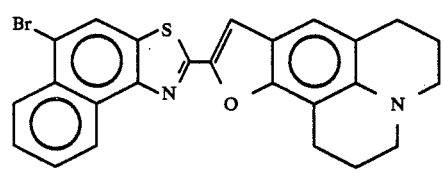
II-4
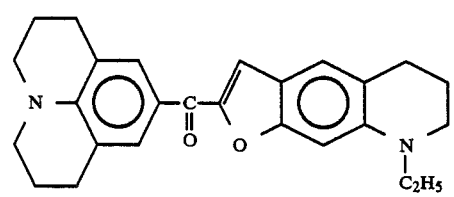
II-5
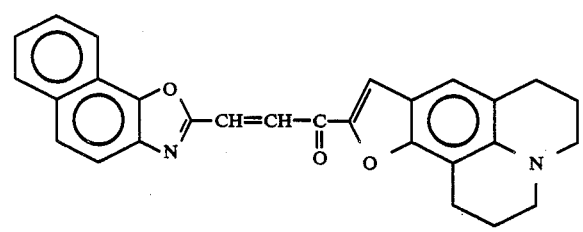
II-6
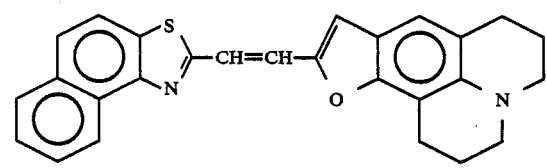
II-7
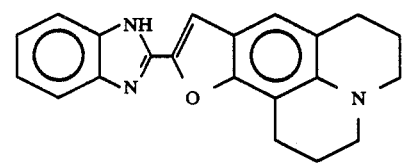
II-8

-continued
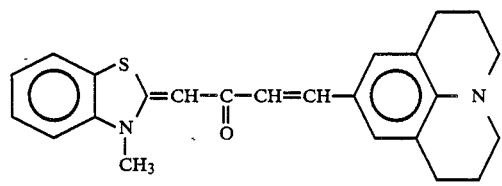
III-1
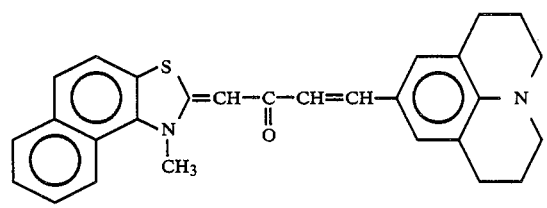
III-2
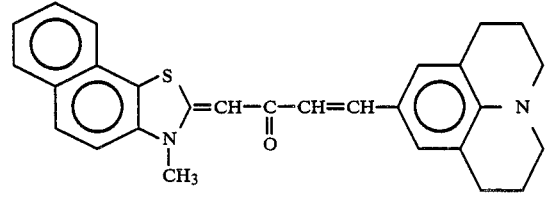
III-3
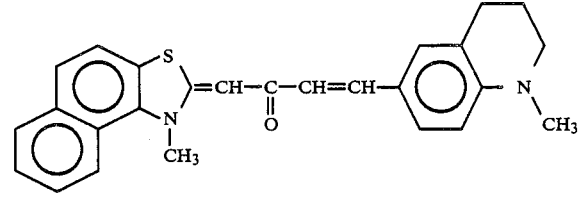
III-4
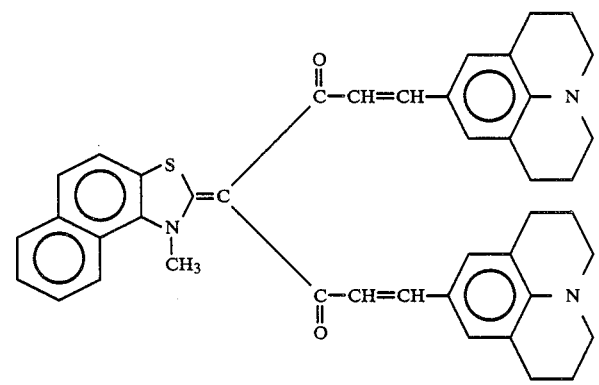
III-5
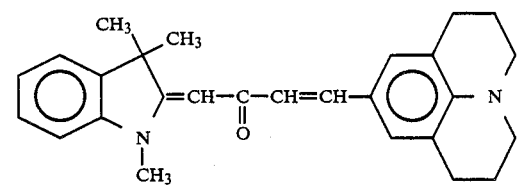
III-6
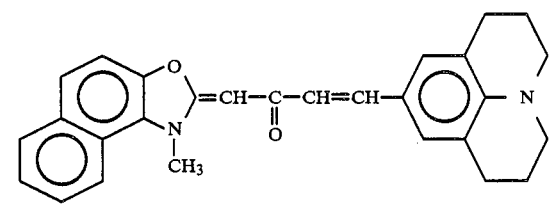
III-7

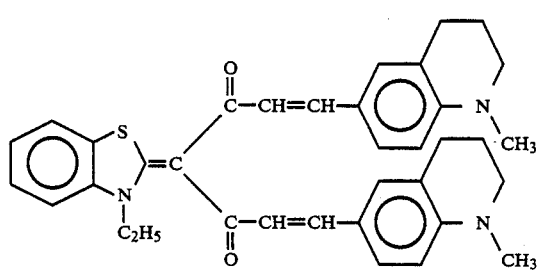 III-8
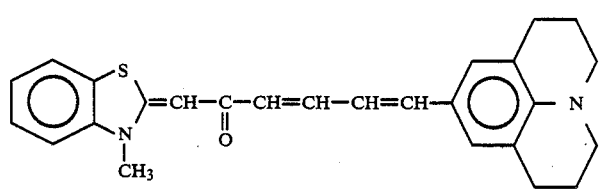 III-9
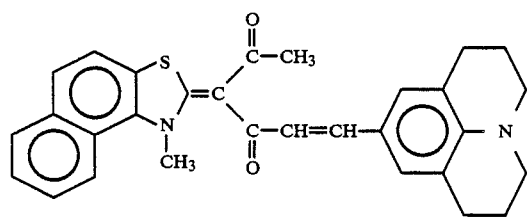 III-10
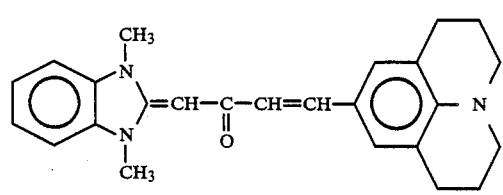 III-11
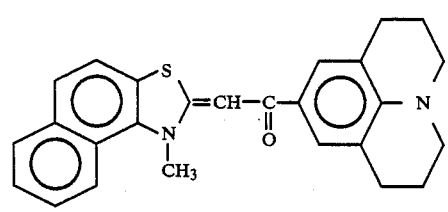 III-12
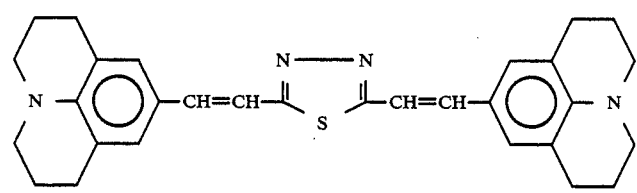 IV-1
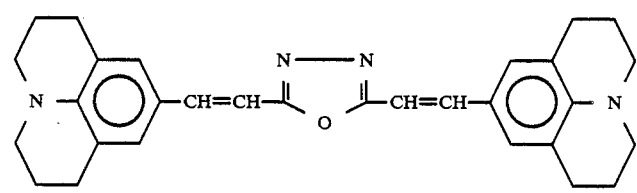 IV-2

-continued

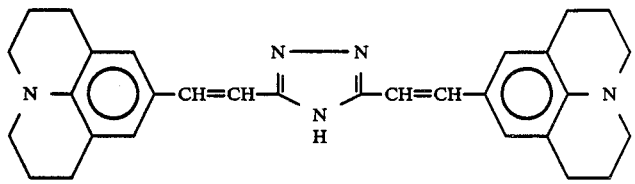
IV-3

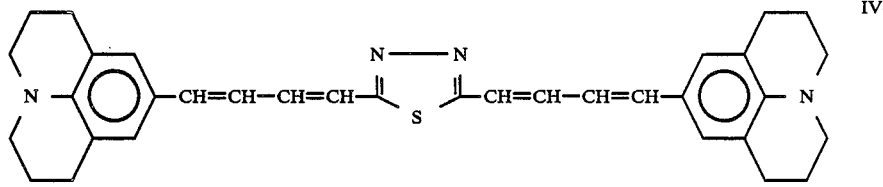
IV-4

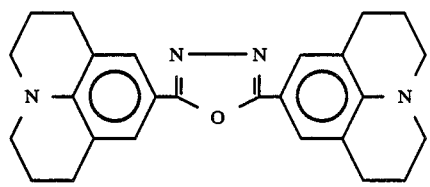
IV-5

In the foregoing, sensitizers of the present invention are exemplified. Among them, particularly preferred are the following compounds.

Among the compounds of the formula I, particularly preferred are those wherein ring A is a benzene or naphthalene ring, X is —S—, —O— or —NH—, $R^1$ and $R^2$ bond to each other to form a 1,3-propylene group, $R^3$ is hydrogen and l is 1 or 2.

Among the compounds of the formula II, particularly preferred are those wherein $R^1$ and $R^2$ are as defined above, Ar is a p-dialkylaminophenyl group, a benzothiazolyl group or a naphthothiazolyl group, m is 0 and n is 0 or 1.

Among the compounds of the formula III, particularly preferred are those wherein ring A, $R^1$, $R^2$ and $R^3$ are as defined above, X is —S— or

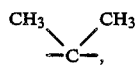

l is 1, $R^4$ is hydrogen and $R^5$ is methyl or ethyl.

Among the compounds of the formula IV, particularly preferred are those wherein $R^1$, $R^2$ and $R^3$ are as defined above, l is 1 or 2 and X is —S— or —O—.

Especially preferred are the compounds of the formulas I-1, I-11, II-1, II-4 and III-1. Now, a method for preparing the above exemplified series of sensitizers will be described. These compounds are usually prepared by a method wherein a heterocyclic compound is used as a starting material and a tetrahydroquinoline structure is introduced thereto, or a method wherein a derivative having a tetrahydroquinoline structure is used as an intermediate and a heterocyclic ring is formed by a ring closure reaction of the intermediate. Representative compounds of the sensitizers represented by the respective formulas may be prepared, for example, by the following methods.

The compounds of the formula I or IV may be prepared by the dehydration condensation of a methyl-substituted derivative of a condensed heterocyclic ring and an aldehyde of a tetrahydroquinoline derivative in the presence of an acid or base catalyst. The compounds of the formula II may be obtained by the condensation of a monohalogenated methyl compound and an o-hydroxyaldehyde of a tetrahydroquinoline derivative. The compounds of the formula III may be obtained by acetylating a 2-methyl derivative of a condensed heterocyclic ring, followed by the dehydration condensation with an aldehyde of a tetrahydroquinoline derivative in the presence of an alkali catalyst. These methods are exemplified in Preparation Examples 1 to 3 given hereinafter. For the preparation of the above-mentioned sensitizers, other methods of preparation may be employed.

In the present invention, at least one type of the above-mentioned sensitizers is used.

The second component (b) constituting the photopolymerization initiator system of the present invention is an activator which is capable of generating active radicals when irradiated in the presence of the above-mentioned sensitizer. As such an activator, any activator may be employed so long as it is capable of forming active radicals by inducing some action together with the sensitizer excited by irradiation. Preferred activators include, for example, a hexaarylbiimidazole, a halogenated hydrocarbon derivative, an organic thiol compound and a diaryl iodonium salt. Especially when a hexaarylbiimidazole and an organic thiol compound are used in combination, the sensitivity is remarkably increased.

The hexaarylbiimidazole includes, for example, 2,2'-bis(o-chlorophenyl)-4,4',5,5'-tetraphenylbiimidazole (hereinafter referred to simply as b-1), 2,2'-bis(o-bromophenyl)-4,4',5,5'-tetraphenylbiimidazole (hereinafter referred to simply as b-2), 2,2'-bis(o,p-dichlorophenyl)-4,4',5,5'-tetraphenylbiimidazole, 2,2'-bis(o-chlorophenyl)-4,4',5,5'-tetra(m-methoxyphenyl)-biimidazole (hereinafter referred to simply as b-3), 2,2'-bis(o,o'-dichlorophenyl)-4,4',5,5'-tetraphenylbiimidazole, 2,2'-bis(o-nitrophenyl)-4,4',5,5'-tetraphenylbiimidazole and 2,2'-bis(o-methylphenyl)-4,4',5,5'-tetraphenylbiimidazole.

The above halogenated hydrocarbon derivative includes, for example, 2,4,6-tris(trichloromethyl)-s-triazine (hereinafter referred to simply as b-4), 2,4,6-tris(tribromomethyl)-s-triazine, 2-methyl-4,6-di(trichloromethyl)-s-triazine, 2-(p-methoxyphenyl)-4,6-di(trichloromethyl)-s-triazine, 2,2,2-trichloromethylacetophenone, tribromomethylphenylsulfone and 2-trichloromethyl-5-(p-methoxystyryl)-1,3,4-oxadiazole.

The organic thiol compound includes, for example, 2-mercaptobenzothiazole (hereinafter referred to simply as b-5), 2-mercaptobenzoxazole (hereinafter referred to simply as b-6), 2-mercaptobenzoimidazole (hereinafter referred to simply as b-7), 2-mercapto-4(3H)-quinazolinone and β-mercaptonaphthalene.

The diaryl iodonium salt includes, for example, diphenyliodonium hexafluorophosphate (hereinafter referred to simply as b-8), diphenyliodonium tosylate, diphenyliodonium fluoroborate, diphenyliodonium hexafluoroarsenate, diphenyliodonium chloride, ditolyliodonium hexafluorophosphate, phenyl(p-anisyl)iodonium hexafluorophosphate and bis(m-nitrophenyl)iodonium hexafluorophosphate.

As the activator in the present invention, in addition to those mentioned above, conventional activators, for example, ketoxime esters such as 3-benzoyloxyiminobutan-2-one, organic peroxides such as 3,3',4,4'-tetra(t-butylperoxycarbonyl)benzophenone (hereinafter referred to simply as b-9), and N-phenylglycine and dimedone, may be used.

There is no particular restriction as to the amounts of the sensitizer and the activator constituting the photopolymerization initiating system used for the photopolymerizable composition of the present invention. However, it is preferred to employ from 0.05 to 20 parts by weight, preferably from 0.2 to 10 parts by weight, of the sensitizer and from 0.5 to 70 parts by weight, preferably from 1 to 30 parts by weight, of the activator relative to 100 parts by weight of the ethylenic compound.

The photopolymerizable composition of the present invention preferably further contains an organic polymer substance as a binder for the modification of the composition or for the improvement of the physical properties after the photocuring, in addition to the above-mentioned essential components. Such a binder may be suitably selected depending upon the purpose for improvement such as compatibility, film-forming properties, developing or adhesive properties. Specifically, for example, for the improvement of the developing properties of an aqueous system, an acrylic acid copolymer, a methacrylic acid copolymer, an itaconic acid copolymer, a partially esterified maleic acid copolymer, an acidic cellulose modified product having a carboxyl group in its side chain, a polyethyleneoxide and polyvinylpyrrolidone may be mentioned. For the improvement of the coating film strength and the adhesive properties, a polyether of epichlorohydrin and bisphenol A; a soluble nylon; a polyalkylmethacrylate or polyalkylacrylate such as polymethylmethacrylate; a copolymer of an alkylmethacrylate with acrylonitrile, acrylic acid, methacrylic acid, vinyl chloride, vinylidene chloride or styrene; a copolymer of acrylonitrile with vinyl chloride or vinylidene chloride; a copolymer of a vinyl acetate with vinylidene chloride, a chlorinated polyolefin or vinylchloride; polyvinyl acetate; a copolymer of acrylonitrile with styrene; a copolymer of acrylonitrile with butadiene and styrene; a polyvinyl alkyl ether; a polyvinyl alkyl ketone; a polystyrene; a polyamide; a polyurethane; a polyethyleneterephthalateisophthalate; acetylcellulose and a polyvinyl butyral, may be mentioned. Such a binder may be incorporated in an amount within a range of not more than 500% by weight, preferably not more than 200%, relative to the ethylenic compound.

To the photopolymerizable compound of the present invention, a thermal polymerization inhibitor, a coloring agent, a plasticizer, a surface protecting agent, a lubricant, a coating aid and other additives may be incorporated as the case requires.

The thermal polymerization inhibitor may be, for example, hydroquinone, p methoxyphenol, pyrogallol, catechol, 2,6-di-t-butyl-p-cresol or β-naphthol. The coloring agent may be a pigment such as a phthalocyanine pigment, an azo pigment, carbon black or titanium oxide, or a dye such as ethyl violet, crystal violet, an azo dye, an anthraquinone dye or a cyanine dye. Such a thermal polymerization inhibitor or coloring agent may be used preferably in an amount of from 0.01 to 3% by weight and from 0.1 to 20% by weight, respectively, relative to the total amount of the ethylenic compound and the binder when the binder is used.

The plasticizer includes, for example, dioctyl phthalate, didodecyl phthalate, triethylene glycol dicaprylate, dimethyl glycol phthalate, tricrezyl phosphate, dioctyl adipate, dibutyl sebacate and triacetyl glycerol. When a binder is used, it may be incorporated in an amount of not more than 10% by weight relative to the total weight of the ethylenic compound and the binder.

The photopolymerizable composition of the present invention may be used by forming it into a photosensitive material without using a solvent, or by dissolving it in a suitable solvent to form a solution and coating the solution on a substrate, followed by drying to obtain a photosensitive material. The solvent includes, for example, methyl ethyl ketone, cyclohexanone, butyl acetate, amyl acetate, ethyl propionate, toluene, xylene, monochlorobenzene, carbon tetrachloride, trichloroethylene, trichloroethane, dimethylformamide, methyl cellosolve, ethyl cellosolve, tetrahydrofuran and pentoxone.

The substrate used for the preparation of a photosensitive material by using the photopolymerizable composition of the present invention, may be any substrate which is commonly employed. For example, it may be a sheet of a metal such as aluminum, magnesium, copper, zinc, chromium, nickel or iron or an alloy containing such a metal as the main component, a paper such as a high quality paper, art paper, releasing paper, an inorganic sheet such as a glass sheet or a ceramics sheet, or a sheet of a polymer such as polyethylene terephthalate, polyethylene, polymethyl methacrylate, polyvinyl chloride, a vinyl chloride-vinylidene chloride copolymer, polystyrene, 6-nylon, cellulose triacetate or cellulose acetatebutylate.

Further, conventional techniques to prevent adverse effects such as the deterioration of the sensitivity or the deterioration of the storage stability due to oxygen may be applied to the photopolymerizable composition of the present invention. For example, a removable transparent cover sheet may be provided on the photosensitive layer, or a coating layer of e.g. wax substance or water-soluble polymer having low oxygen permiability, may be provided.

There is no particular restriction as to the light source for radiation applicable to the composition of the present invention. The commonly employed light source containing visual light rays of at least 400 nm may suitably be used, such as a carbon arc, a high pressure mercury lamp, a xenone lamp, a metal halide lamp, a fluorescent lamp, a tungsten lamp, a helium-cadminium laser or an argon ion laser.

Now, the present invention will be described in further detail with reference to Preparation Examples, Composition Examples, Reference Examples and Comparative Examples. However, it should be understood that the present invention is by no means restricted by these specific Examples.

PREPARATION EXAMPLE 1 (Preparation of sensitizer 4.1 g of julolidine-9-carbaldehyde prepared from julolidine by using dimethylformamide and phosphorus oxychloride by a usual method, 3.2 g of 2-methylnaphtho(1,2-d)thiazole and 1 g of p-toluene sulfonic acid were reacted under a nitrogen atmosphere at 120° C. for 9 hours. The reaction product was cooled to 80° C., and toluene and an aqueous sodium carbonate solution were added thereto, followed by stirring. The desired product thereby formed was extracted. The organic layer was treated by column chromatography to obtain 1.9 g of sensitizer I-1 as a reddish brown solid (mp: 164°-170° C.).

| Elemental analysis: | C | H | N |
|---|---|---|---|
| Calculated values: | 78.50 | 5.80 | 7.32 |
| Analytical values: | 78.47 | 6.01 | 7.09 |

PREPARATION EXAMPLE 2 (Preparation of sensitizer II-1)

5 g of p-dimethylaminoacetophenone was dissolved in 9 ml of 47 wt % hydrobromic acid, and the solution was maintained at 65° C. Then, a solution obtained by dissolving 5 g of bromine in 7.5 ml of the same hydrogen bromide as mentioned above, was dropwise added thereto, and the reaction was conducted at the same temperature for one hour. The reaction mixture was cooled to room temperature, and 100 ml of an aqueous solution containing 20 g of sodium hydrogen carbonate was added thereto for neutralization. Then, the mixture was extracted with chloroform to obtain 5.7 g of a brominated acetophenone compound (mp: 93° C.). On the other hand, 4.6 g of 9-formyl-8-hydroxyjulolidine obtained by aldehyde-modifying 8-hydroxyjulolidine by using dimethylformamide and phosphorus oxychloride in accordance with a usual method and 1.4 g of potassium hydroxide were dissolved in 15 ml of ethanol. To this solution, the entire amount of the above-mentioned brominated acetophenone compound was added at 70° C., and the mixture was reacted at the same temperature for 3 hours. The reaction mixture was cooled to room temperature and then treated by column chromatography to obtain 2.2 g of sensitizer II-1 as orange red crystals (mp: 170°-172° C.).

| Elemental analysis: | C | H | N |
|---|---|---|---|
| Calculated values: | 76.64 | 6.71 | 7.77 |
| Analytical values: | 76.73 | 6.76 | 7.79 |

PREPARATION EXAMPLE 3 (Preparation of sensitizer III-1)

6.8 g of 2,N-dimethylbenzothiazolium tosylate was dispersed in 20 ml of dry pyridine and stirred. Then, 3.4 g of acetyl bromide was dropwise added thereto under cooling with ice, and the mixture was maintained at the same temperature for 30 minutes and at room temperature for 30 minutes and then reacted at 100° C. for 30 minutes.

Then, pyridine was distilled off under reduced pressure, and the reaction product was dispersed in water. Crystals were collected by filtration to obtain 2.7 g of N-methyl-2-acetylmethylenebenzothiazoline compound. On the other hand, 1.1 g of sodium hydroxide was dissolved in 18 ml of ethanol and 7 ml of water. To this solution, the entire amount of the above-mentioned benzothiazoline compound and 3.5 g of julolidine-9-carboaldehyde as used in Preparation Example 1 were added, and the mixture was reacted at 80° C. for 12 hours. After the reaction, water was added to the reaction mixture, and the obtained solid was further treated by column chromatography to obtain orange crystals (mp: 254°-258° C.).

| Elemental analysis: | C | H | N |
|---|---|---|---|
| Calculated values: | 74.19 | 6.23 | 7.21 |
| Analytical values: | 73.82 | 6.51 | 7.03 |

Now, Examples of the present invention wherein the sensitizers thus obtained are used will be described. The deviations for the sensitizers and the activators used description. Further, the abbreviations for activators used in Comparative Examples and Reference Examples are the same as used before, but for the sensitizers, the following abbreviations will be used for the respective compounds.

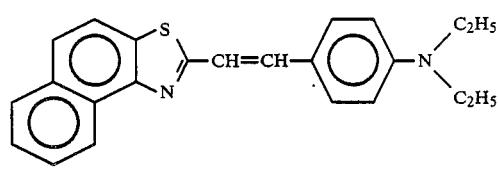

R-I-1

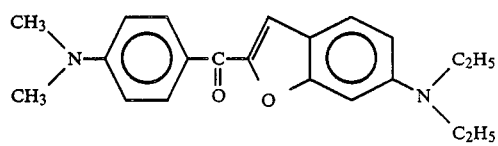

R-II-1

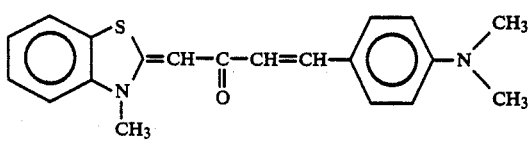
R-III-1

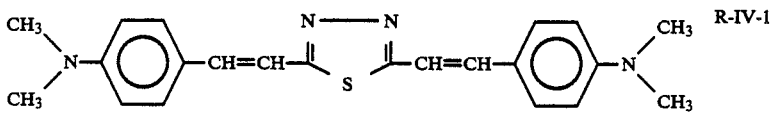
R-IV-1

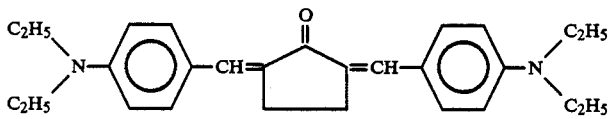
Std

Among them, the sensitizers R-I-1 to R-IV-1 were used as they have structures similar to the sensitizers I-1 to IV-1 of the present invention, and Std is a sensitizer for the visible light as disclosed in Japanese Unexamined Patent Publication No. 2528/1972 and was used as the standard for the relative sensitivity. R-1-1 and R-III-1 are compounds covered by Japanese Unexamined Patent Publication Nos. 21401/1982 and 74551/1984, respectively.

The relative sensitivity is the value obtained by the following procedure. Firstly, a photosensitive sample to be evaluated and a standard photosensitive sample (sensitizer Std was used) were exposed under the same exposure condition through $\sqrt{2}$ step tablets (masking films whereby the amount of light decreases by $1/\rho 2$ every step, manufactured by Eastman Kodak Company) and developed to obtain the number of curing steps of the samples. The relative sensitivity is given by the following equation.

$$\text{Relative sensitivity} = \frac{(\sqrt{2})^n}{(\sqrt{2})^{n_{Std}}}$$

where n is the number of curing steps for the photosensitive sample to be evaluated and $n_{Std}$ is the number of curing steps for the standard photosensitive sample.

The amounts of the sensitizers and the activators are shown hereinafter by "%" which means "% by weight" relative to the total weight of the ethylenic compound and the binder.

EXAMPLES 1 to 3, REFERENCE EXAMPLE 1 and COMPARATIVE EXAMPLES 1 to 3

10 g of a methyl methacrylate,.methacrylic acid copolymer (weight average molecular weight: 45,000, copolymerization ratio: 85/15), 10 g of trimethylolpropane triacrylate, 60 mg of methoxyphenol and 60 mg of Victoria Pure Blue-BOH were dissolved in 180 g of methyl ethyl ketone to obtain a photosensitive stock solution. This stock solution was divided, and to each divided solution, activators b-1 (amount: 5%) and b-5 (amount: 5%) as well as the sensitizer as identified in Table 1 (amount: 2%) were added and dissolved to obtain a photosensitive solution. Each photosensitive solution was whirl coated on a grained and anodized aluminum sheet so that the dried film thickness would be 2.5 μm, followed by drying at 70° C. for 5 minutes. On its surface, an aqueous polyvinyl alcohol solution was coated to form an overcoat layer having a dried film thickness of 3 μm, whereby a photosensitive test sample was obtained. Then, it was secured in an exposure frame with the above-mentioned step tablet overlaid thereon, and exposure was conducted for 20 seconds through a glass filter L-42 (manufactured by Toshiba Glass K.K.) capable of completely cutting ultraviolet rays and permitting visible light rays to pass through. Then, development was conducted by an aqueous solution containing 9% by weight of butyl cellosolve and 1% by weight of sodium silicate, and from the obtained number of photocuring steps, the relative sensitivity was determined in accordance with the above described procedure using Comparative Example 3 as the standard. The results are shown in Table 1.

TABLE 1

| | Sensitizer | Relative sensitivity |
|---|---|---|
| Example 1 | I-1 | 6.7 |
| Example 2 | II-1 | 8.0 |
| Example 3 | III-1 | 8.0 |
| Reference Example 1 | R-II-1 | 2.8 |
| Comparative Example 1 | R-I-1 | 4.0 |
| Comparative Example 2 | R-III-1 | 2.0 |
| Comparative Example 3 | Std | 1.0 |

EXAMPLES 4 to 37, REFERENCE EXAMPLES 2 and 3 and COMPARATIVE EXAMPLES 4 to 6

Except for the exposure condition, the measurements were conducted in the same manner as in Example 1 by using the sensitizers as identified in Table 2 (amount: 2%).

As the exposure condition, light rays having a wavelength of about 490 nm obtained by passing light rays from a xenone lamp through both a colored glass filter Y-47 and interference filter KL-49 (both manufactured by Toshiba Glass K.K.), were irradiated for 10 seconds. The results are shown in Table 2.

TABLE 2

| | Sensitizer | Relative sensitivity |
|---|---|---|
| Example 4 | I-1 | 13.5 |
| Example 5 | I-2 | 11.3 |
| Example 6 | I-3 | 14.7 |
| Example 7 | I-4 | 13.5 |
| Example 8 | I-5 | 5.7 |
| Example 9 | I-6 | 8.0 |
| Example 10 | I-7 | 6.7 |

TABLE 2-continued

|  | Sensitizer | Relative sensitivity |
|---|---|---|
| Example 11 | I-8 | 16.0 |
| Example 12 | I-9 | 11.3 |
| Example 13 | I-10 | 9.5 |
| Example 14 | I-11 | 13.5 |
| Example 15 | I-12 | 13.5 |
| Example 16 | I-13 | 9.5 |
| Example 17 | I-14 | 5.7 |
| Example 18 | I-15 | 4.0 |
| Example 19 | I-18 | 13.5 |
| Example 20 | I-22 | 11.3 |
| Example 21 | I-23 | 9.5 |
| Example 22 | I-24 | 16.0 |
| Example 23 | I-25 | 9.5 |
| Example 24 | II-1 | 11.3 |
| Example 25 | II-2 | 13.5 |
| Example 26 | II-3 | 5.7 |
| Example 27 | II-4 | 16.0 |
| Example 28 | III-1 | 13.5 |
| Example 29 | III-2 | 13.5 |
| Example 30 | III-3 | 11.3 |
| Example 31 | III-4 | 9.5 |
| Example 32 | III-5 | 11.3 |
| Example 33 | III-6 | 11.3 |
| Example 34 | III-10 | 9.5 |
| Example 35 | IV-1 | 11.3 |
| Example 36 | IV-2 | 11.3 |
| Example 37 | IV-4 | 8.0 |
| Reference Example 2 | R-II-1 | 2.0 |
| Reference Example 3 | R-IV-1 | 2.0 |
| Comparative Example 4 | R-I-1 | 4.0 |
| Comparative Example 5 | R-III-1 | 2.4 |
| Comparative Example 6 | Std | 1.0 |

EXAMPLES 38 to 44 and COMPARATIVE EXAMPLE 7

Except for the exposure condition, the measurements were conducted in the same manner as in Example 1 by using the sensitizers as identified in Table 3.

As the exposure condition, light rays having a wavelength of 436 nm obtained by passing light rays from a high pressure mercury lamp through both colored glass filter L-42 and interference filter KL-43 (both manufactured by Toshiba Glass K.K.) were irradiated. The results are shown in Table 3.

TABLE 3

|  | Sensitizer | Relative sensitivity |
|---|---|---|
| Example 38 | I-1 | 9.5 |
| Example 39 | II-1 | 16.0 |
| Example 40 | III-2 | 13.5 |
| Example 41 | IV-1 | 9.5 |
| Example 42 | I-16 | 8.0 |
| Example 43 | I-20 | 5.7 |
| Example 44 | I-21 | 6.7 |
| Comparative Example 7 | Std | 1.0 |

EXAMPLES 45 to 5I and COMPARATIVE EXAMPLE 8

The evaluation was conducted in the same manner as in Example 4 except that the type of the activator was changes as shown in Table 4. The results obtained by using the sensitizers as identified in Table 4 are shown in the same Table.

TABLE 4

|  | Sensitizer | Activator [Amount] | Relative sensitivity |
|---|---|---|---|
| Example 45 | I-1 | b-2 [5%] b-5 [5%] | 16.0 |
| Example 46 | I-1 | b-2 [5%] b-6 [5%] | 13.5 |
| Example 47 | I-1 | b-2 [5%] b-7 [5%] | 9.5 |
| Example 48 | I-1 | b-3 [5%] b-6 [5%] | 13.5 |
| Example 49 | II-1 | b-2 [5%] b-6 [5%] | 13.5 |
| Example 50 | II-1 | b-3 [5%] b-6 [5%] | 11.3 |
| Example 51 | III-2 | b-2 [5%] b-6 [5%] | 16.0 |
| Comparative Example 8 | Std | b-2 [5%] b-6 [5%] | 1.0 |

EXAMPLE 52 to 60 and COMPARATIVE EXAMPLE 9

The evaluation was conducted in the same manner as in Example 4 by using the sensitizers as identified in Table 5 (amount: 5%) except that the type of the activator was changed as identified in Table 5. The results are shown in Table 5.

TABLE 5

|  | Sensitizer | Activator | Relative sensitivity |
|---|---|---|---|
| Example 52 | I-1 | b-1 | 11.3 |
| Example 53 | II-1 | b-1 | 9.5 |
| Example 54 | II-1 | b-4 | 8.0 |
| Example 55 | II-1 | b-8 | 13.5 |
| Example 56 | III-2 | b-4 | 9.5 |
| Example 57 | III-2 | b-8 | 9.5 |
| Example 58 | IV-1 | b-4 | 8.0 |
| Example 59 | IV-1 | b-8 | 8.0 |
| Example 60 | I-1 | b-9 | 11.3 |
| Comparative Example 8 | Std | b-1 | 1.0 |

EXAMPLE 61

The same photosensitive material as used in Example 4 was scanned by a beam of an argon ion laser (GLG 3300 manufactured by Nippon Electric Company Limited). A laser beam of 488 nm was passed through a neutral density filter to reduce the amount of light and then focused &o have a beam diameter of 15 μm at the surface of the photosensitive material, whereupon scanning was conducted with a beam intensity of 2.4 mW at a scanning speed of 50.6 m/sec, whereby a cured image line with a width of 15 mm was obtained.

COMPARATIVE EXAMPLE 10

The same photosensitive material as used in Comparative Example 4 was scanned for exposure under the same condition as in Example 61, whereby no cured image line was formed.

The photopolymerizable composition of the present invention has extremely high sensitivity to visible light rays, particularly to long wavelength light rays. Accordingly, the composition is useful in a wide range of application fields. For example, it is useful for the preparation of printing plates such as a lithographic plate, an intaglio and a letterpress, a photoresist for formation of printed circuits or integrated circuits, a dry film, an image forming material such as a relief image or image reproduction, a photocurable ink, coating material and adhesive. Thus, the composition of the present invention is very useful from the industrial point of view.

What is claimed is:

1. A photopolymerizable composition comprising an addition polymerizable compound having at least one ethylenically unsaturated double bond and a photopolymerization initiator system, wherein the photopolymerization initiator system comprises:

(a) at least one sensitizer selected from the group consisting of a compound of the formula:

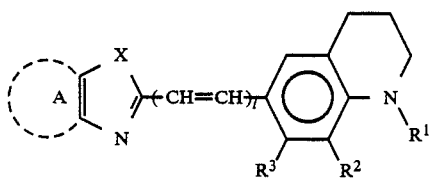
(I)

wherein ring A is a substituted or unsubstituted benzene or naphthalene ring, X is a bivalent atom or a bivalent group, $R^1$ is an alkyl group, each of $R^2$ and $R^3$ is hydrogen, an alkyl group, an alkoxy group or an alkylthio group, or $R^1$ and $R^2$ bond to each other, and l is 0, 1 or 2, a compound of the formula:

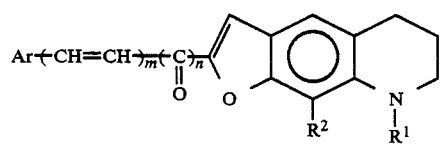
(II)

wherein $R^1$ and $R^2$ are as defined above, Ar is an aromatic group, and each of n and m is 0 or 1, a compound of the formula:

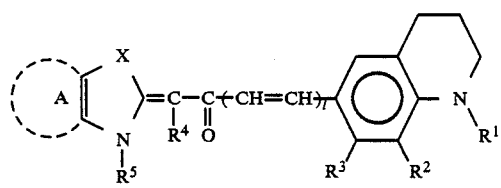
(III)

wherein $R^1$, $R^2$, $R^3$, ring A, X and l are as defined above, $R^4$ is hydrogen, an acetyl group or

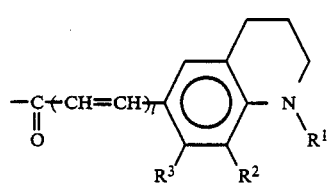

wherein $R^1$, $R^2$, $R^3$ and l are as defined above, and $R^5$ is an alkyl group, and a compound of the formula:

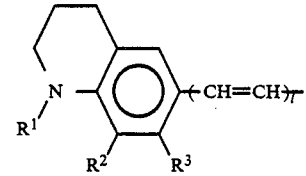
(IV)

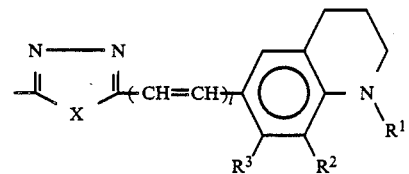

wherein $R^1$, $R^2$, $R^3$, X and l are as defined above, and (b) at least one activator capable of generating active radicals when irradiated in the presence of said sensitizer.

2. The composition according to claim 1, wherein the sensitizer is a compound of the formula:

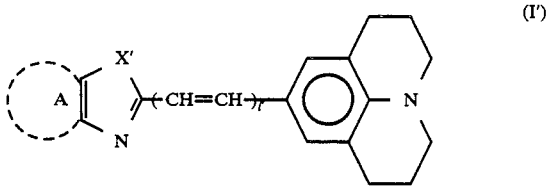
(I')

wherein ring A' is a benzene ring or a naphthalene ring, X' is —S—, —O— or —NH—, and l is 1 or 2.

3. The composition according to claim 1, wherein the sensitizer is a compound of the formula:

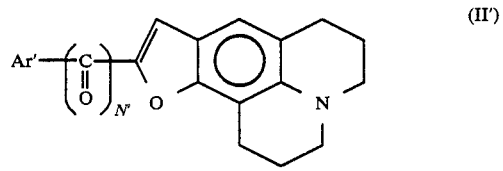
(II')

wherein Ar is a p-dialkylaminophenyl group, a benzothiazolyl group or a naphthothiazolyl group, and n' is 0 or 1.

4. The composition according to claim 1, wherein the sensitizer is a compound of the formula:

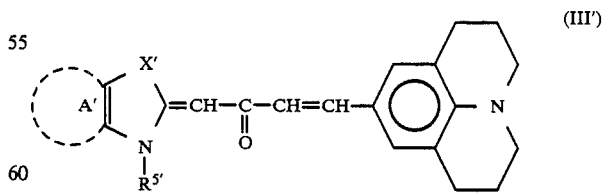
(III')

wherein ring A' is a benzene ring or a naphthalene ring, X, is —S— or $$\begin{array}{c} CH_3 \quad CH_3 \\ \diagdown \diagup \\ -C- \end{array}$$

, and $R^{5'}$ is a methyl group or an ethyl group.

5. The composition according to claim 1, wherein the sensitizer is a compound of the formula:

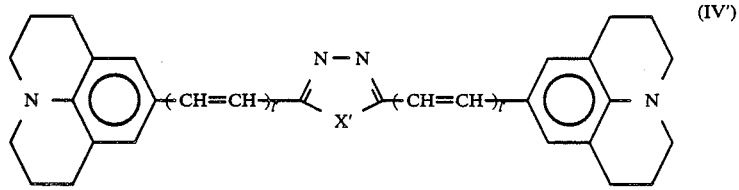
(IV')

wherein X, is —S— or —O—, and l' is 1 or 2.

6. The composition according to claim 1, wherein the sensitizer is

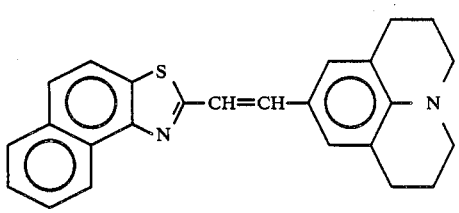

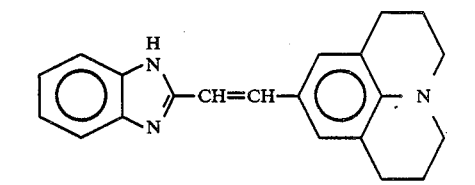

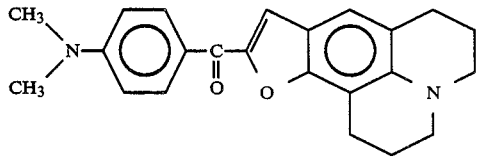

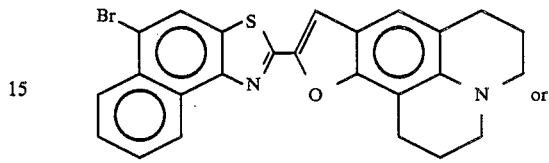
or

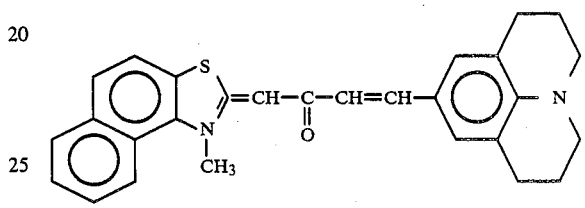

7. The composition according to claim 1, wherein the activator is at least one member selected from the group consisting of a hexaarylbiimidazole, a halogenated hydrocarbon derivative, an organic thiol compound and a diaryl iodonium salt.

8. The composition according to claim 7, wherein the activator is a combination of a hexaarylbiimidazole and an organic thiol compound.

9. The composition according to claim 1, wherein the addition polymerizable compound having at least one ethylenically unsaturated double bond is an acrylate or a methacrylate.

10. The composition according to claim 1, which contains from 0.05 to 20 parts by weight of the sensitizer and from 0.5 to 70 parts by weight of the activator relative to 100 parts by weight of the addition polymerizable compound having at least one ethylenically unsaturated double bond.

* * * * *

UNITED STATES PATENT AND TRADEMARK OFFICE
CERTIFICATE OF CORRECTION

PATENT NO. : 4,966,830

DATED : OCTOBER 30, 1990

INVENTOR(S) : HIDEKI NAGASAKA ET AL.

It is certified that error appears in the above-identified patent and that said Letters Patent is hereby corrected as shown below:

On the title page:
   In the Foreign Application Priority Data, please insert the following priority data:
   --JUNE 13, 1988  Japan........145037--.

Signed and Sealed this

Third Day of March, 1992

Attest:

HARRY F. MANBECK, JR.

Attesting Officer

Commissioner of Patents and Trademarks